US006993214B2

(12) United States Patent
Nishimura et al.

(10) Patent No.: US 6,993,214 B2
(45) Date of Patent: Jan. 31, 2006

(54) LIGHT EMITTING DEVICE AND DISPLAY UNIT USING IT

(75) Inventors: Teiichiro Nishimura, Kanagawa (JP); Masao Nishiguchi, Kanagawa (JP); Keiichi Kagami, Kanagawa (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 10/722,697

(22) Filed: Nov. 24, 2003

(65) Prior Publication Data

US 2004/0160154 A1 Aug. 19, 2004

(30) Foreign Application Priority Data

Nov. 26, 2002 (JP) .......................... P2002-342831

(51) Int. Cl.
*G02B 6/12* (2006.01)

(52) U.S. Cl. ........................ 385/14; 385/129; 385/130; 385/141; 385/901

(58) Field of Classification Search .................. 385/14, 385/88, 92, 129, 130, 131, 901, 141

See application file for complete search history.

(56) References Cited

U.S. PATENT DOCUMENTS

| | | | | |
|---|---|---|---|---|
| 6,284,342 | B1 * | 9/2001 | Ebisawa et al. | 428/69 |
| 6,489,045 | B1 * | 12/2002 | Araki et al. | 428/690 |
| 6,593,689 | B2 * | 7/2003 | Hayashi et al. | 313/504 |
| 2001/0020085 | A1 * | 9/2001 | Ueda et al. | 528/425 |
| 2002/0041147 | A1 * | 4/2002 | Shirakawa | 313/498 |
| 2003/0006699 | A1 * | 1/2003 | Ogino et al. | 313/506 |
| 2003/0042472 | A1 * | 3/2003 | Fujita et al. | 252/500 |

* cited by examiner

*Primary Examiner*—Brian M. Healy
(74) *Attorney, Agent, or Firm*—Sonnenschein, Nath & Rosenthal LLP

(57) ABSTRACT

The invention provides a light emitting device which can prevent irregular color by reducing film thickness distribution and a display unit using it. A first electrode, an organic layer including a light emitting layer, a second electrode including a semi-transparent electrode are sequentially layered on a driving substrate. The light emitting layer has a red light emitting layer, a green light emitting layer, and a blue light emitting layer. The light emitting layer is formed by transferring a raw solution by every color, and then removing the solvent. An optical distance between a first end of the first electrode and a second end of the second electrode satisfies $(2L)/\lambda+\Phi/(2\pi)=m$. $\lambda$ represents a peak wavelength of a spectrum of a light desired to be extracted, $\Phi$ represents a phase shift of reflected lights generated in the first end and the second end, and m represents an integer.

16 Claims, 16 Drawing Sheets

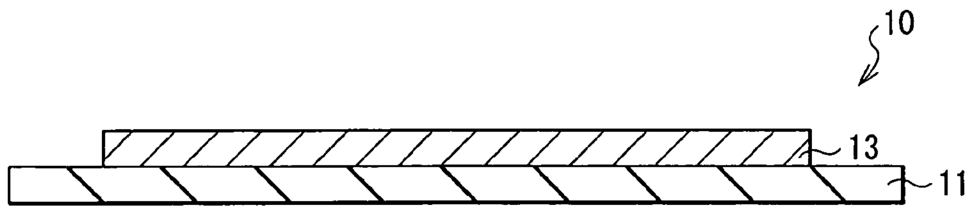
FIG. 3
FIG. 4A
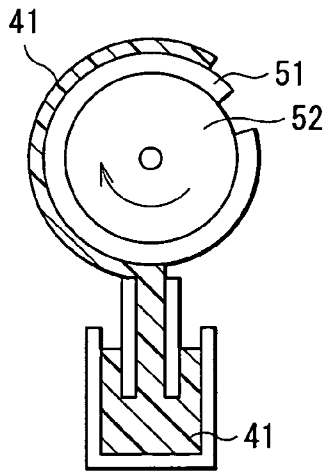
FIG. 4B
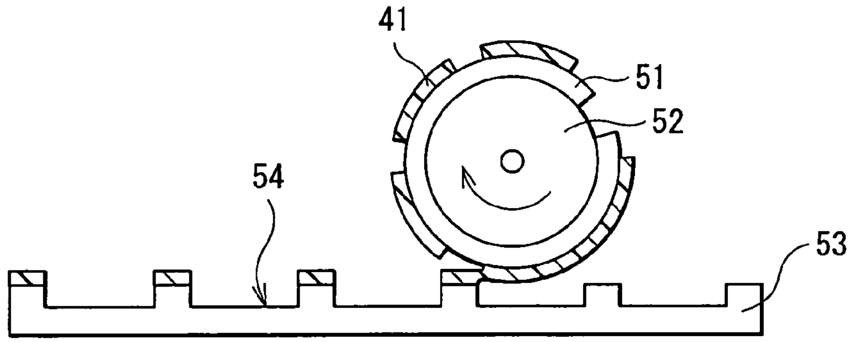

LIGHT EMITTING DEVICE AND DISPLAY UNIT USING IT

RELATED APPLICATION DATA

The present application claims priority to Japanese Application(s) No(s). P2002-342831 filed Nov. 26, 2003, which application(s) is/are incorporated herein by reference to the extent permitted by law.

BACKGROUND OF THE INVENTION

1. Field of the Invention

The present invention relates to a light emitting device and a display unit using it, and more particularly such a self-luminous type light emitting device such as an organic light emitting device and a display unit using it.

2. Description of the Related Art

In these years, as a display unit instead of a liquid crystal display, an organic electroluminescence display which uses organic light emitting devices has been noted. The organic electroluminescence display has characteristics that its visual field angle is wide and its power consumption is low since it is a self-luminous type display. The organic electric field light emitting display is also thought of as a display having sufficient response to high-definition high-speed video signals, and is under development toward the practical use.

FIG. 1 shows a construction of a conventional organic light emitting device. This organic light emitting device has, for example, a structure wherein a transparent electrode 112 and an organic layer 113 are layered in this order on a substrate 111 made of an insulating material such as glass from the substrate 111 side. In the organic layer 113, an electron hole transport layer 113A and a light emitting layer 113B are layered in this order from the substrate 111 side. Lights generated in the light emitting layer 113B are extracted from the substrate 111 side.

However, in such a conventional organic light emitting device, a peak width of a spectrum of the extracted light is wide, and particularly, peak wavelengths of green and blue lights are considerably shifted. Therefore, there is a problem that a color reproduction range sufficient to display television picture cannot be obtained.

Therefore, trials to control lights generated in a light emitting layer, for example, a trial to improve color purity of light emitting colors and light emitting efficiency by introducing a resonator structure to the organic light emitting device have been made (for example, refer to International Publication No. 01/39554). In the organic light emitting device wherein such a resonator structure is introduced, a width of a spectrum of the extracted light can be narrowed, and peak luminance can be raised, so that a color reproduction range can be expanded.

There are two kinds of this organic light emitting device: one is made of a low molecular weight material, and the other is made of a high molecular weight material. As a manufacturing method for the device made of a high molecular weight material, ink jet printing method is generally known.

However, when the organic layer is formed by the ink jet printing method, there is a problem that variation of film thickness is high. Therefore, since it is necessary to precisely control film thickness particularly when the foregoing resonator structure is introduced, there is a problem that irregular color occurs with the ink jet printing method, so that it is difficult to obtain a color reproduction range sufficient to display, for example, television picture. This problem is significant when a high molecular weight material is used for the light emitting layer.

SUMMARY OF THE INVENTION

In light of the foregoing, it is an object of the invention to provide a light emitting device which can prevent irregular color by reducing film thickness distribution and a display unit using it.

A light emitting device according to the invention comprises a layer including a light emitting layer between a first electrode and a second electrode, wherein at least part of the layer including the light emitting layer is formed by transferring a raw solution and then removing a solvent.

A display unit according to the invention comprises a light emitting device comprising a layer including a light emitting layer between a first electrode and a second electrode, wherein at least part of the layer including the light emitting layer is formed by transferring a raw solution and then removing the solvent.

In the light emitting device according to the invention, at least part of the layer including the light emitting layer is formed by transferring a raw solution and then removing the solvent. Therefore, its film thickness distribution is reduced, and irregular color is prevented.

In the display unit according to the invention, the light emitting device according to the invention is provided. Therefore, its film thickness distribution is reduced, and irregular color is prevented.

Other and further objects, features and advantages of the invention will appear more fully from the following description.

BRIEF DESCRIPTION OF THE DRAWINGS

FIG. 3 is a cross sectional view showing a manufacturing method for the display unit illustrated in FIG. 2 in order of process;

FIGS. 4A and 4B are cross sectional views showing a process following the process illustrated in FIG. 3;

DETAILED DESCRIPTION OF THE PREFERRED EMBODIMENT

An embodiment of the invention will be described in detail hereinbelow with reference to the drawings.

Figure 2:
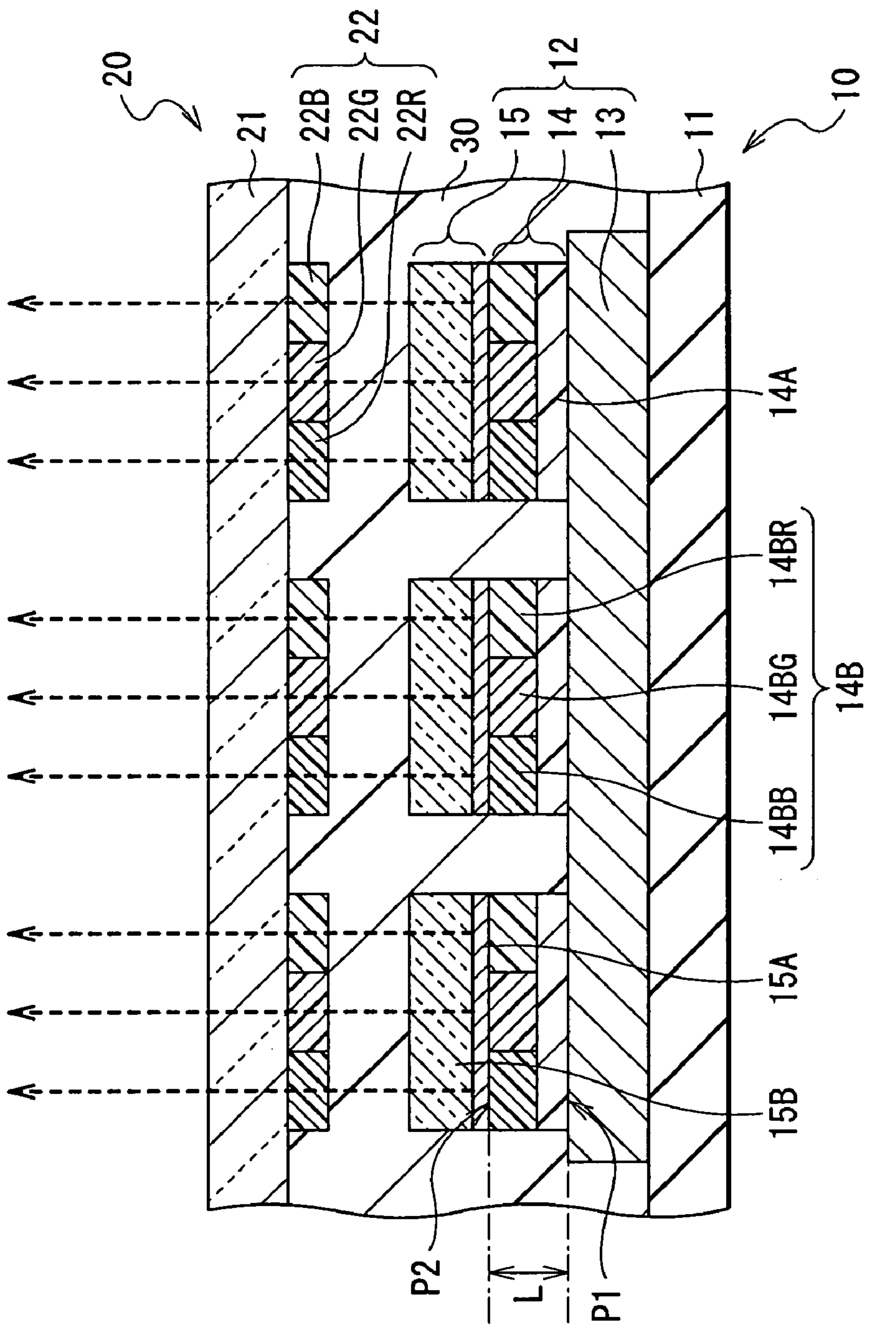
FIG. 2 is a cross sectional view showing a construction of a display unit using organic light emitting devices which are light emitting devices according to an embodiment of the invention.

FIG. 2 shows a cross sectional structure of a display unit using organic light emitting devices which are light emitting devices according to an embodiment of the invention. This display unit is used as an ultrathin organic electroluminescence color display unit or the like, and, for example, a driving panel 10 and a sealing panel 20 are placed opposite, and their whole faces are bonded together by an adhesive layer 30. The driving panel 10 is provided with a plurality of organic light emitting devices 12 in a matrix state as a whole on a driving substrate 11 made of an insulating material such as glass.

In the organic light emitting device 12, for example, a first electrode 13 as an anode, an organic layer 14, and a second electrode 15 as a cathode are layered in this order from the driving substrate 11 side. The first electrode 13 is a common electrode for the plurality of organic light emitting devices 12 located, for example, in column direction, and the second electrode 15 is a common electrode for the plurality of organic light emitting devices 12 located, for example, in row direction.

The first electrode 13 also has a function as a reflection layer, so that it is desirable that the first electrode 13 has reflectance as high as possible in order to improve light emitting efficiency. For example, as a material to make the first electrode 13, a simple substance or an alloy of metal elements with high work function such as platinum (Pt), gold (Au), silver (Ag), chrome (Cr), tungsten (W) and the like can be cited. It is preferable that a thickness of the first electrode 13 in layer direction (hereinafter simply referred to as "thickness") is set to 100 nm to 300 nm. As an alloy material, for example, AgPdCu alloy whose main base is silver, including palladium (Pd) of 0.3 wt % to 1 wt % and copper (Cu) of 0.3 wt % to 1 wt % can be cited.

The organic layer 14 has a structure wherein an electron hole transport layer 14A and a light emitting layer 14B are layered in this order from the first electrode 13 side. Lights generated in the light emitting layer 14B are extracted from the second electrode 15 side. A function of the electron hole transport layer 14A is to improve efficiency to inject electron holes into the light emitting layer 14B. A function of the light emitting layer 14B is to produce lights by current injection. The light emitting layer 14B also functions as an electron transport layer. The electron hole transport layer 14A and the light emitting layer 14B are formed by transferring a raw solution and then removing a solvent as described later. A total thickness of the electron hole transport layer 14A and the light emitting layer 14B is preferably, for example, from 15 nm to 100 nm.

The electron hole transport layer 14A is made of a conductive polymeric material such as poly(3,4)-ethylene dioxythiophene (PEDOT), or polyaniline.

The light emitting layer 14B has a red light emitting layer 14BR which generates red lights, a green light emitting layer 14BG which generates green lights, and a blue light emitting layer 14BB which generates blue lights. The red light emitting layer 14BR, the green light emitting layer 14BG, and the blue light emitting layer 14BB are arranged in parallel with each other between the first electrode 13 and the second electrode 15.

The red light emitting layer 14BR is made of a polymeric organic light emitting material such as poly [{9,9-dihexyl-2,7-bis(1-cyanovinylene) fluorenylene}-alt-co-{2,5-bis(N, N'-diphenylamino)-1,4-phenylene}] shown in Chemical formula 1. The polymeric material means what has a molecular mass of 10,000 or more.

[Chemical formula 1]

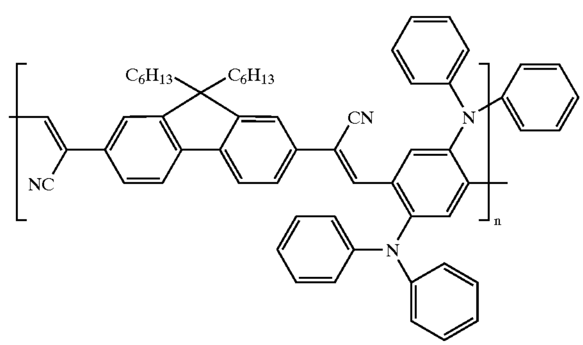

The green light emitting layer 14BG is made of a polymeric organic light emitting material such as poly [{9,9-dioctylfluorenyl-2,7-dityl}-co-(1,4-diphenylene-vinylene-2-methoxy-5-{2-ethyl hexyloxy}-benzene)] shown in Chemical formula 2.

[Chemical formula 2]

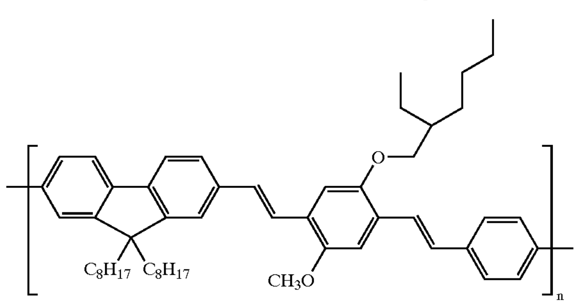

The blue light emitting layer 14BB is made of a polymeric organic light emitting material such as poly [{9,9-dioctyl fluorenyl-2,7-dityl}-co-{1,4-(2,5-dimethoxy)benzene}] shown in Chemical formula 3.

[Chemical formula 3]

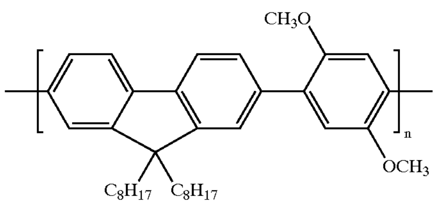

The second electrode 15 has a structure wherein a semi-transparent electrode 15A having semi-transparency for the lights generated in the light emitting layer 14B, and a transparent electrode 15B having transparency for the lights generated in the light emitting layer 14B are layered in this order from the organic layer 14 side. The semi-transparent electrode 15A has, for example, a thickness of 5 nm to 50 nm, and is made of a simple substance or an alloy of metal elements with a low work function such as aluminum (Al), magnesium (Mg), calcium (Ca), sodium (Na) and the like. Specially, an alloy of magnesium and silver (hereinafter referred to as "MgAg alloy") is preferable, and a volume ratio of magnesium and silver is preferably Mg:Ag=5:1 to 30:1. In addition, a laminated structure of a calcium layer and an MgAg alloy layer is possible.

The semi-transparent electrode 15A also has a function as a semi-transparent reflection layer. That is, this organic light emitting device 12 has a resonator structure wherein lights generated in the light emitting layer 14B are resonated and extracted from a second end P2 side, by setting an end face of the first electrode 13 on the light emitting layer 14B side to a first end P1, setting an end face of the second electrode 15 on the light emitting layer 14B side to the second end P2, and setting the organic layer 14 to a resonance part. It is preferable that the organic light emitting device 12 has such a resonator structure, since the lights generated in the light emitting layer 14B generate multiple interference, and act as a kind of narrow band filter, so that a half value width of spectrums of the lights to be extracted is reduced and color purity can be improved. Further, it is preferable that the organic light emitting device 12 has such a resonator structure, since outside lights which enter from the sealing panel 20 can be also attenuated by the multiple interference, and reflectance of outside lights in the organic light emitting device 12 can be extremely lowered in combination with a color filter 22 described later.

To that end, it is preferable that an optical distance L between the first end P1 and the second end P2 of the resonator satisfies mathematical formula 1, and a resonance wavelength of the resonator (peak wavelength of a spectrum of an extracted light) corresponds to a peak wavelength of a spectrum of a light desired to be extracted. Actually, it is preferable that the optical distance L is selected to be a positive minimum value which satisfies the mathematical formula 1.

$$(2L)/\lambda+\Phi/(2\pi)=m \quad \text{[Mathematical formula 1]}$$

(In the formula, L represents an optical distance between the first end P1 and the second end P2, $\Phi$ represents a sum ($\Phi=\Phi_1+\Phi_2$) (rad) of phase shift $\Phi_1$ of a reflected light generated in the first end P1 and phase shift $\Phi_2$ of a reflected light generated in the second end P2, $\lambda$ represents a peak wavelength of a spectrum of a light desired to be extracted from the second end P2 side, and m represents an integer to make L positive, respectively. In the mathematical formula 1, units for L and $\lambda$ should be common, for example, nm is used as a common unit.)

As a concrete construction of the organic light emitting device 12 which satisfies the mathematical formula 1, for example, where peak wavelength $\lambda$ of a spectrum of a light desired to be extracted is 635 nm for red light, 535 nm for green light, and 450 nm for blue light, a laminated structure wherein the first electrode 13 made of chrome, the electron hole transport layer 14A having a thickness of 20 nm made of poly(3,4)-ethylene dioxythiophene or polyaniline, the red light emitting layer 14BR having a thickness of 75 nm made of the polymeric organic light emitting material shown in Chemical formula 1, the green light emitting layer 14BG having a thickness of 65 nm made of the polymeric organic light emitting material shown in Chemical formula 2, the blue light emitting layer 14BB having a thickness of 45 nm made of the polymeric organic light emitting material shown in Chemical formula 3, and the semi-transparent electrode 15A having a laminated structure of a calcium layer having a thickness of 10 nm and an MgAg alloy layer having a thickness of 12 nm are sequentially layered can be cited.

A function of the transparent electrode 15B is to lower electric resistance of the semi-transparent electrode 15A, and the transparent electrode 15B is made of a conductive material having translucency sufficient for the lights generated in the light emitting layer 14B. As a material making the transparent electrode 15B, for example, indium tin oxide (ITO), a compound containing indium, zinc (Zn), and oxygen, and the like are preferable, since with such materials, good conductivity can be obtained even when deposition is made under room temperature. A thickness of the transparent electrode 15B is preferably, for example, from 30 nm to 1,000 nm.

The sealing panel 20 is located on the second electrode 15 side of the driving panel 10, and comprises a sealing substrate 21 to seal the organic light emitting devices 12 with the adhesive layer 30. The sealing substrate 21 is made of a material such as glass which is transparent to lights generated in the organic light emitting device 12. In the sealing substrate 21, for example, the color filter 22 is provided, so that lights generated in the organic light emitting device 12 are extracted, outside lights reflected in the organic light emitting device 12 and wiring between each organic light emitting device 12 are absorbed, and contrast is improved.

The color filter 22 can be provided on either side of the sealing substrate 21. However, it is preferable to provide the color filter 22 on the driving panel 10 side, since the color filter 22 is not exposed on the surface, and can be protected by the adhesive layer 30. The color filter 22 comprises a red filter 22R, a green filter 22G, and a blue filter 22B, which are orderly arranged corresponding to the red light emitting layer 14BR, the green light emitting layer 14BG, and the blue light emitting layer 14BB.

The red filter 22R, the green filter 22G, and the blue filter 22B are respectively, for example, formed in the shape of rectangle with no space between them. The red filter 22R, the green filter 22G, and the blue filter 22B are respectively made of a resin mixed with a pigment. The red filter 22R, the green filter 22G, and the blue filter 22B are adjusted so that light transmittance in the targeted red, green, or blue wavelength band becomes high and light transmittance in other wavelength bands becomes low by selecting a pigment.

Further, a wavelength range with high transmittance in the color filter 22 corresponds to a peak wavelength $\lambda$ of a spectrum of a light desired to be extracted from the resonator structure. Therefore, among the outside lights which enter from the sealing panel 20, only the lights having a wavelength equal to a peak wavelength λ of a spectrum of an extracted light pass through the color filter 22, and other outside lights having other wavelengths are prevented from intruding into the organic light emitting device 12.

The display unit having these organic light emitting devices 12, for example, can be manufactured as below.

FIG. 3 to FIGS. 12A, 12B, and 12C show a manufacturing method for this display unit in order of process. First, as shown in FIG. 3, on the driving substrate 11 made of the foregoing material, the first electrode 13 made of the foregoing material is formed by, for example, DC spattering.

Next, as shown in FIG. 4A, as an ink to form the electron hole transport layer 14A by transfer, a raw solution for electron hole transport layer 41 containing the foregoing material for the electron hole transport layer 14A and a solvent is prepared. When poly(3,4)-ethylene dioxythiophene is used as a material for the electron hole transport layer 14A, water is used as a solvent. When polyaniline is used as a material for the electron hole transport layer 14A, an organic solvent is used as a solvent. Subsequently, this raw solution for electron hole transport layer 41 is applied to an application face for electron hole transport layer 51. The application face for electron hole transport layer 51 is, for example, made of a sheet member arranged so that the sheet member is wound around a roller for electron hole transport layer 52. The raw solution for electron hole transport layer 41 is applied to the application face for electron hole transport layer 51, accompanied by rotation of the roller for electron hole transport layer 52. As a material for the application face for electron hole transport layer 51, for example, a silicone resin which is easily processed and has a high resistance to the organic solvent is preferable, and an urethane material and the like are preferable when water is used as a solvent.

Figure 5A:
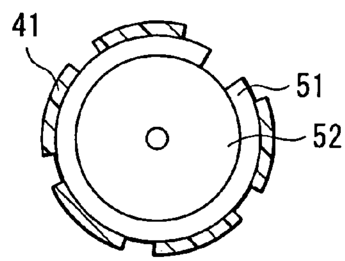
FIGS. 5A, 5B, and 5C are cross sectional views showing a process following the process illustrated in FIG. 4B.

After that, as shown in FIG. 4B, a relief printing plate for electron hole transport layer 53 wherein concave portions 54 are formed corresponding to a pattern of the electron hole transport layer 14A of the organic light emitting device 12 on the driving substrate 11 is prepared. By rotating or rolling the roller for electron hole transport layer 52 on the relief printing plate for electron hole transport layer 53, the raw solution for electron hole transport layer 41 on the application face for electron hole transport layer 51 is selectively removed. Then, it is possible either to rotate and move the roller for electron hole transport layer 52, or to move the relief printing plate for electron hole transport layer 53. It is also possible to move both the roller for electron hole transport layer 52 and the relief printing plate for electron hole transport layer 53. Consequently, as shown in FIG. 5A, the raw solution for electron hole transport layer 41 remains on the application face for electron hole transport layer 51, corresponding to the pattern of the electron hole transport layer 14A.

Figure 5B:
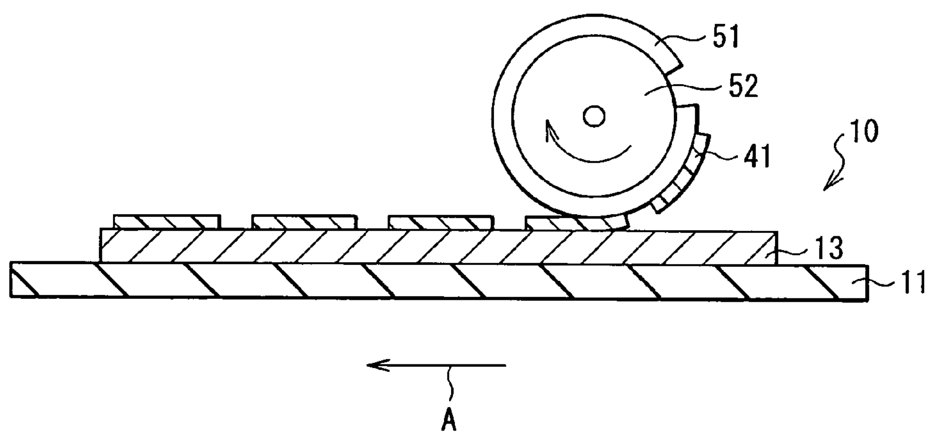
Figure 5C:
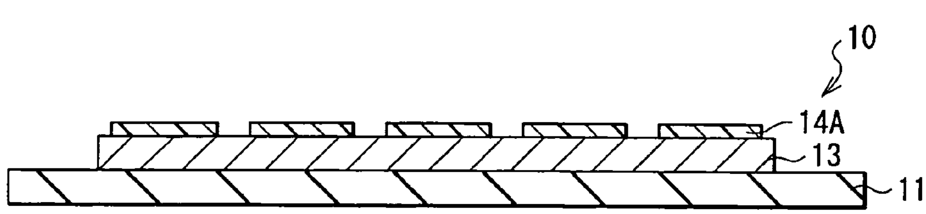

Next, as shown in FIG. 5B, by rotating or rolling the roller for electron hole transport layer 52 on the driving substrate 11 on which the first electrode 13 is formed, raw solution for electron hole transport layer 41 remaining on the application face for electron hole transport layer 51 is transferred. Then, it is possible either to rotate and move the roller for electron hole transport layer 52, or to move the driving substrate 11 in the direction of arrow A. It is also possible to move both the roller for electron hole transport layer 52 and the driving substrate 11. After that, the solvent is removed, and as shown in FIG. 5C, the electron hole transport layer 14A is formed on the first electrode 13. As above, since the electron hole transport layer 14A is formed by transferring the raw solution for electron hole transport layer 41, and then removing the solvent, film thickness distribution of the electron hole transport layer 14A is reduced compared to in a conventional case wherein the electron hole transport layer is formed by spin coat method.

Figure 6A:
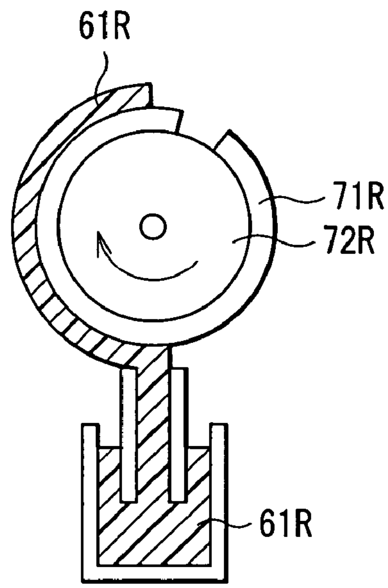
FIGS. 6A and 6B are cross sectional views showing a process following the process illustrated in FIG. 5C.

After forming the electron hole transport layer 14A, for example, as shown in FIG. 6A, as an ink to form the red light emitting layer 14BR, a red raw solution 61R containing the polymeric organic light emitting material shown in Chemical formula 1 and xylene as the solvent is prepared. The red raw solution 61R is applied to a red application face 71R which is wound around a red roller 72R, as in the case of the electron hole transport layer 14A. The red application face 71R is constructed as in the application face for electron hole transport layer 51. That is, since an organic solvent is used for a solvent here, it is preferable that the red application face 71R is made of a silicone resin.

Figure 6B:
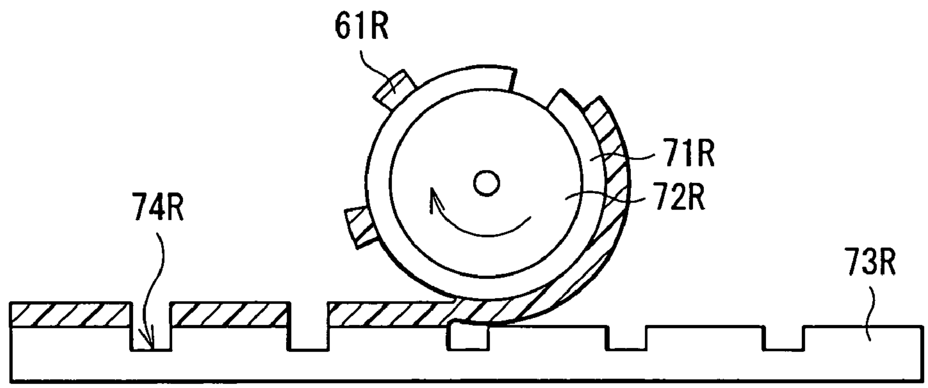
Figure 7A:
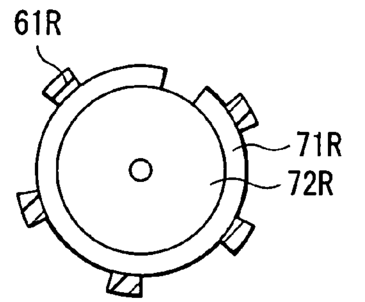
FIGS. 7A, 7B, and 7C are cross sectional views showing a process following the process illustrated in FIG. 6B.

Next, as shown in FIG. 6B, a red relief printing plate 73R wherein concave portions 74R are formed corresponding to a pattern of the red light emitting layer 14BR of the organic light emitting device 12 on the driving substrate 11 is prepared. By rotating or rolling the red roller 72R on the red relief printing plate 73R as in the case of the electron hole transport layer 14A, the red raw solution 61R is selectively removed. Consequently, as shown in FIG. 7A, the red raw solution 61R remains on the red application face 71R, corresponding to the pattern of the red light emitting layer 14BR.

Figure 7B:
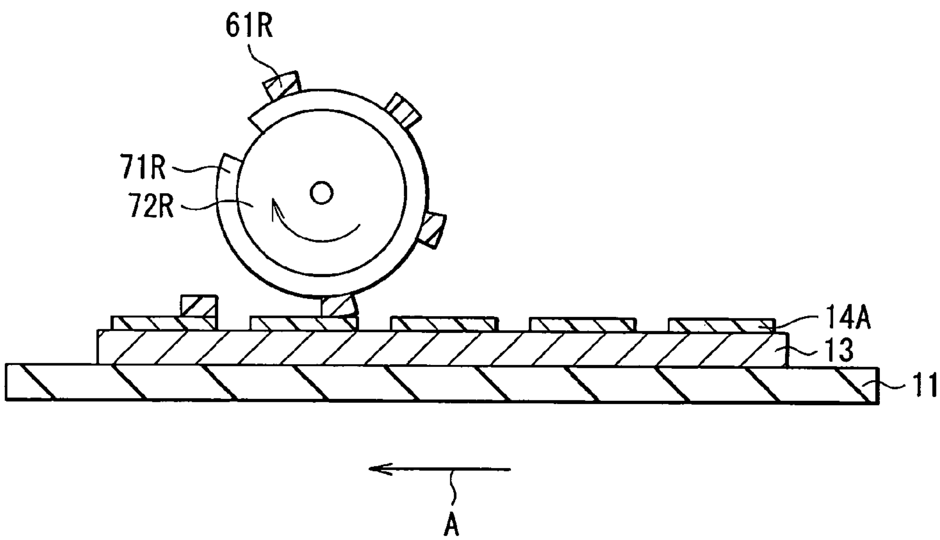
Figure 7C:
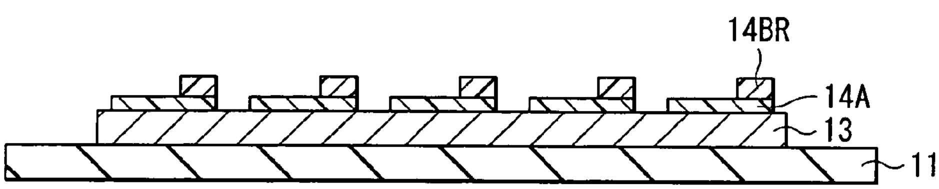

Next, as shown in FIG. 7B, by rotating or rolling the red roller 72R on the driving substrate 11 on which the first electrode 13 and the electron hole transport layer 14A are formed as in the case of the electron hole transport layer 14A, the red raw solution 61R is transferred. After that, the solvent is removed, and as shown in FIG. 7C, the red light emitting layer 14BR is formed.

Figure 8A:
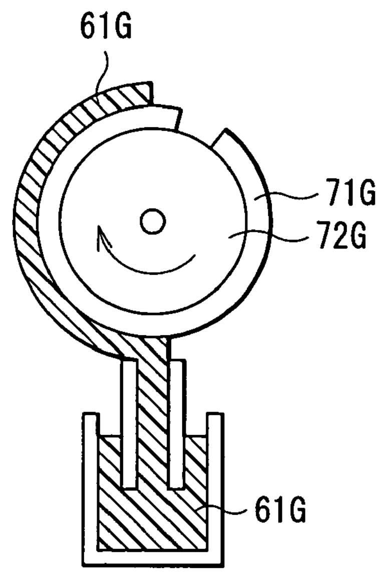
FIGS. 8A and 8B are cross sectional views showing a process following the process illustrated in FIG. 7C.

After forming the red light emitting layer 14BR, for example, as shown in FIG. 8A, as an ink to form the green light emitting layer 14BG, a green raw solution 61G containing the polymeric organic light emitting material shown in Chemical formula 2 and xylene as the solvent is prepared. This green raw solution 61G is applied to a green application face 71G which is wound around a green roller 72G, as in the case of the electron hole transport layer 14A. The green application face 71G is also constructed as in the application face for electron hole transport layer 51.

Figure 8B:
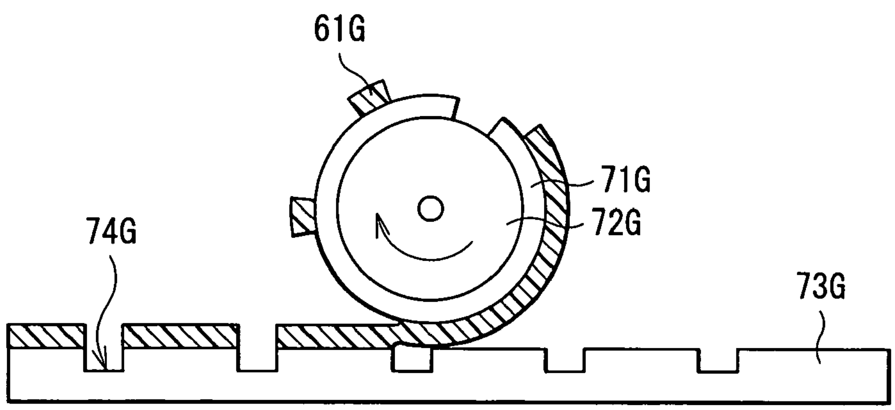
Figure 9A:
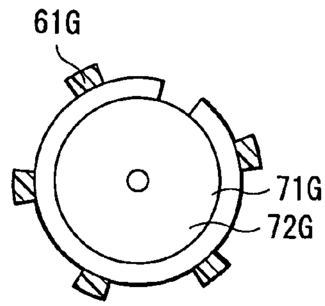
FIGS. 9A, 9B, and 9C are cross sectional views showing a process following the process illustrated in FIG. 8B.

Next, as shown in FIG. 8B, a green relief printing plate 73G wherein concave portions 74G are formed corresponding to a pattern of the green light emitting layer 14BG of the organic light emitting device 12 on the driving substrate 11 is prepared. By rotating or rolling the green roller 72G on the green relief printing plate 73G as in the case of the electron hole transport layer 14A, the green raw solution 61G is selectively removed. Consequently, as shown in FIG. 9A, the green raw solution 61G remains on the green application face 71G, corresponding to the pattern of the green light emitting layer 14BG.

Figure 9B:
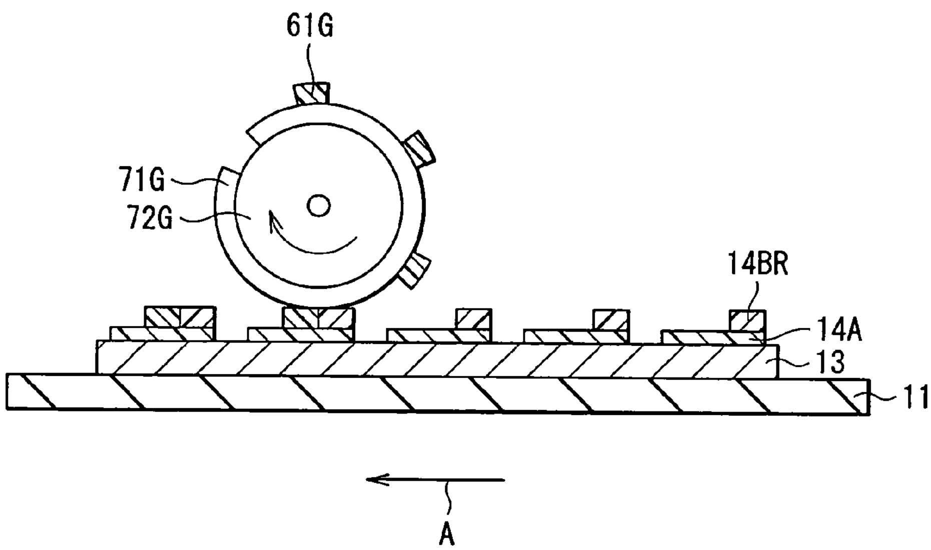
Figure 9C:
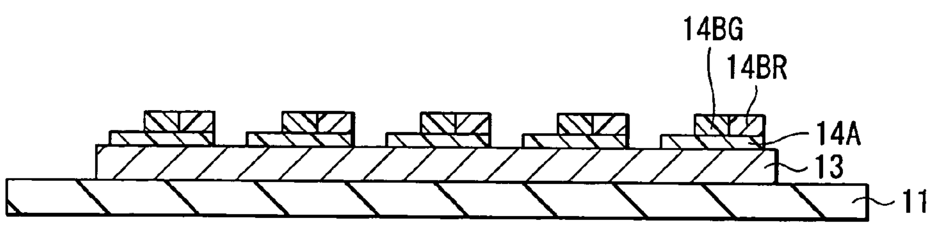

Next, as shown in FIG. 9B, by rotating or rolling the green roller 72G on the driving substrate 11 on which the first electrode 13, the electron hole transport layer 14A, and the red light emitting layer 14BR are formed as in the case of the electron hole transport layer 14A, the green raw solution 61G is transferred. After that, the solvent is removed, and as shown in FIG. 9C, the green light emitting layer 14BG is formed.

Figure 10A:
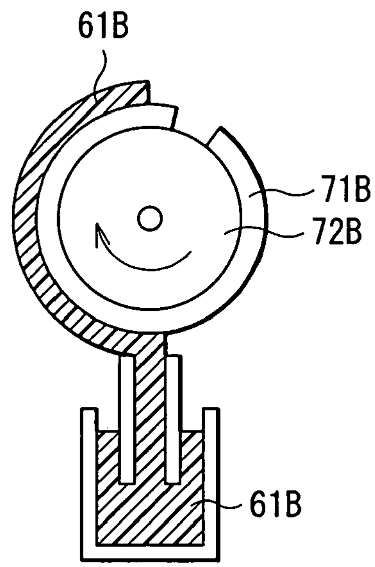
FIGS. 10A and 10B are cross sectional views showing a process following the process illustrated in FIG. 9C.

After forming the green light emitting layer 14BG, for example, as shown in FIG. 10A, as an ink to form the blue light emitting layer 14BB, a blue raw solution 61B containing the polymeric organic light emitting material shown in Chemical formula 3 and xylene as the solvent is prepared. This blue raw solution 61B is applied to a blue application face 71B which is wound around a blue roller 72B, as in the case of the electron hole transport layer 14A. The blue application face 71B is also constructed as in the application face for electron hole transport layer 51.

Figure 10B:
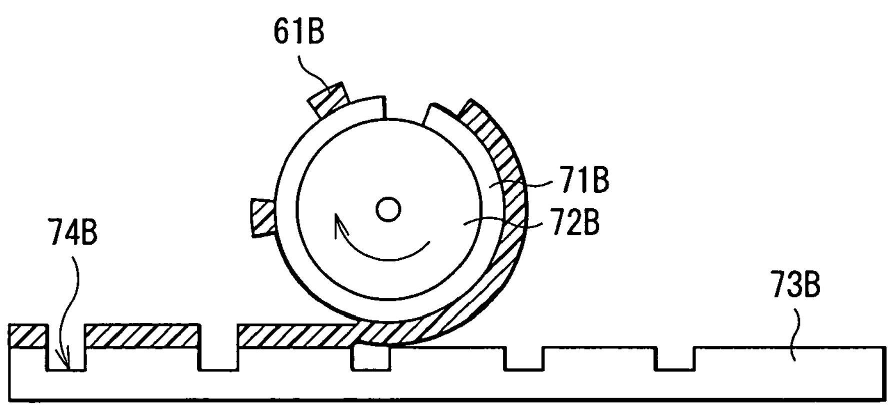
Figure 11A:
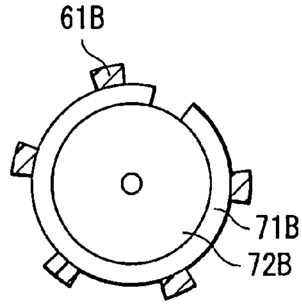
FIGS. 11A, 11B, and 11C are cross sectional views showing a process following the process illustrated in FIG. 10B.

Next, as shown in FIG. 10B, a blue relief printing plate 73B wherein concave portions 74B are formed corresponding to a pattern of the blue light emitting layer 14BB of the organic light emitting device 12 on the driving substrate 11 is prepared. By rotating or rolling the blue roller 72B on the blue relief printing plate 73B as in the case of the electron hole transport layer 14A, the blue raw solution 61B is selectively removed. Consequently, as shown in FIG. 11A, the blue raw solution 61B remains on the blue application face 71B, corresponding to the pattern of the blue light emitting layer 14BB.

Figure 11B:
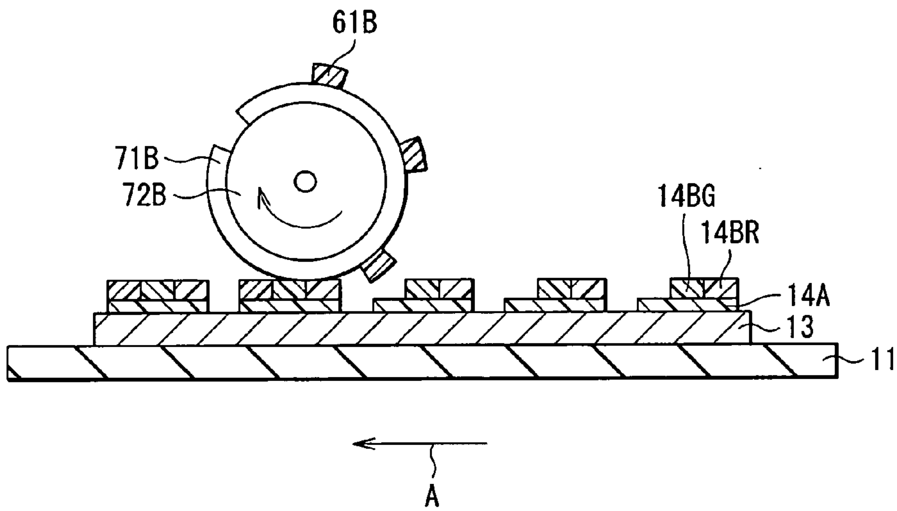
Figure 11C:
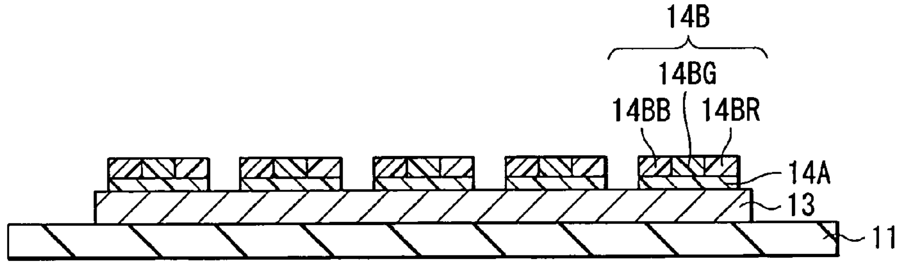

Next, as shown in FIG. 11B, by rotating or rolling the blue roller 72B on the driving substrate 11 on which the first electrode 13, the electron hole transport layer 14A, the red light emitting layer 14BR, and the green light emitting layer 14BG are formed as in the case of the electron hole transport layer 14A, the blue raw solution 61B is transferred. After that, the solvent is removed, and as shown in FIG. 1C, the blue light emitting layer 14BB is formed. Consequently, the light emitting layer 14B having the red light emitting layer 14BR, the green light emitting layer 14BG, and the blue light emitting layer 14BB is formed. As above, the light emitting layer 14B is formed by transferring the red raw solution 61R, the green raw solution 61G, and the blue raw solution 61B which contain the solvent, and then removing the solvent. Therefore, film thickness distribution of the light emitting layer 14B is reduced, compared to in the conventional case wherein the light emitting layer is formed by ink jet printing method.

Figure 12A:
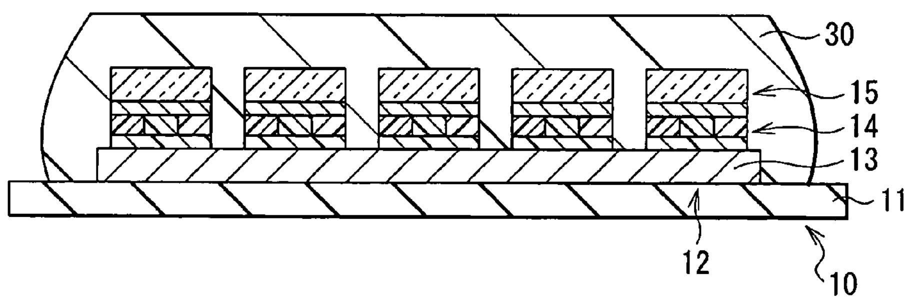
FIGS. 12A, 12B, and 12C are cross sectional views showing a process following the process illustrated in FIG. 11C.

After forming the light emitting layer 14B, as shown in FIG. 12A, for example, by deposition method, the second electrode 15 which has the foregoing thickness and is made of the foregoing material is deposited to form the organic light emitting devices 12 as shown in FIG. 2. Consequently, the driving panel 10 is formed. After that, as shown in FIG. 12A as well, the adhesive layer 30 is formed on the organic light emitting devices 12.

Figure 12B:
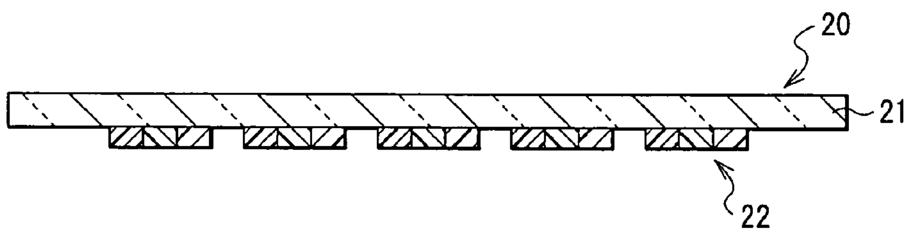

Further, as shown in FIG. 12B, for example, by applying a material of the red filter 22R by spin coat and the like onto the sealing substrate 21 made of the foregoing material, patterning with photolithography technique and firing, the red filter 22R is formed. Subsequently, as shown in FIG. 12B as well, as in the red filter 22R, the blue filter 22B and the green filter 22G are subsequently formed. Consequently, the sealing panel 20 is formed.

After forming the driving panel 10 and the sealing panel 20, as shown in 12C, the driving panel 10 and the sealing panel 20 are bonded with the adhesive layer 30 in between. Then, it is preferable that a face of the sealing panel 20 on which the color filter 22 is formed is placed opposite to the driving panel 10. Consequently, the driving panel 10 and the sealing panel 20 are bonded, and the display unit shown in FIG. 2 is completed.

This display unit, for example, can be also manufactured as follows.

First, as shown in FIG. 3 to FIG. 5C, the first electrode 13 and the electron hole transport layer 14A are formed on the driving substrate 11 in a manner similar to the foregoing method.

Figure 13A:
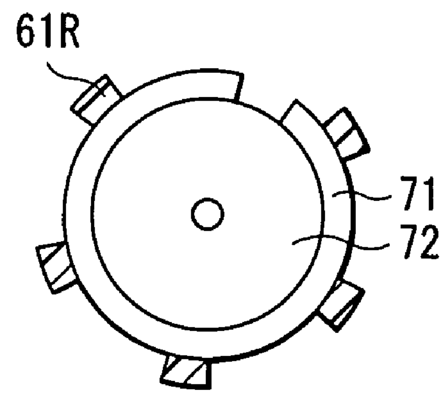
FIGS. 13A, 13B, and 13C are figures showing other manufacturing method for the display unit illustrated in FIG. 2 in order of process.

Next, as shown in FIG. 13A, the red raw solution 61R is applied onto an application face for light emitting layer 71 which is wound around a roller for light emitting layer 72, and the red raw solution 61R is selectively removed by using the red relief printing plate 73R as in the case of the electron transport layer 14A. The application face for light emitting layer 71 is also constructed as in the application face for electron transport layer 51.

Figure 13B:
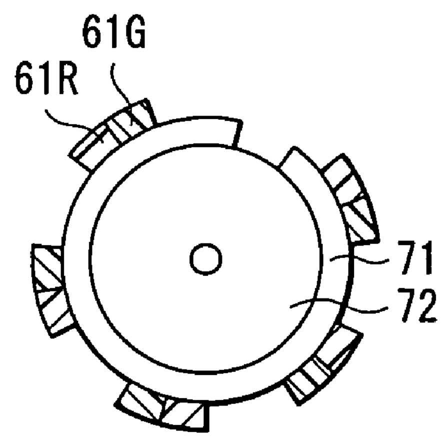

Further, as in the case of the electron transport layer 14A, the green raw solution 61G is applied onto the application face for light emitting layer 71 on which the red raw solution 61R remains as shown in FIG. 13A. At this time, the green raw solution 61G is applied onto the red raw solution 61R. Subsequently, the green raw solution 61G is selectively removed by using the green relief printing plate 73G. Then, the green raw solution 61G applied on the red raw solution 61R is removed. Consequently, as shown in FIG. 13B, the red raw solution 61R and the green raw solution 61G are applied onto the application face for light emitting layer 71.

Figure 13C:
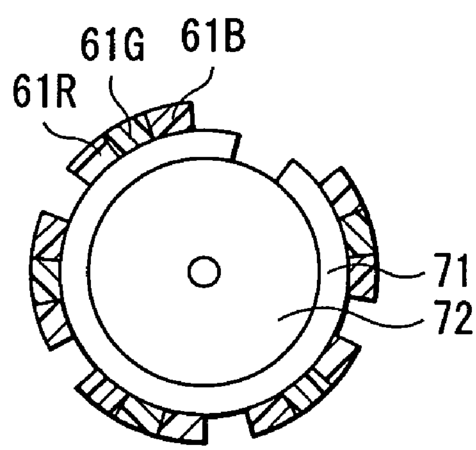

After that, as in the case of the electron hole transport layer 14A, the blue raw solution 61B is applied to the application face for light emitting layer 71 on which the red raw solution 61R and the green raw solution 61G are applied. At this time, the blue raw solution 61B is applied onto the red raw solution 61R and the green raw solution 61G. Subsequently, the blue raw solution 61B is selectively removed by using the blue relief printing plate 73B. Then, the blue raw solution 61B which is applied on the red raw solution 61R and the green raw solution 61G is removed. Consequently, as shown in FIG. 13C, the red raw solution 61R, the green raw solution 61G, and the blue raw solution 61B are applied on the application face for light emitting layer 71.

Figure 14:
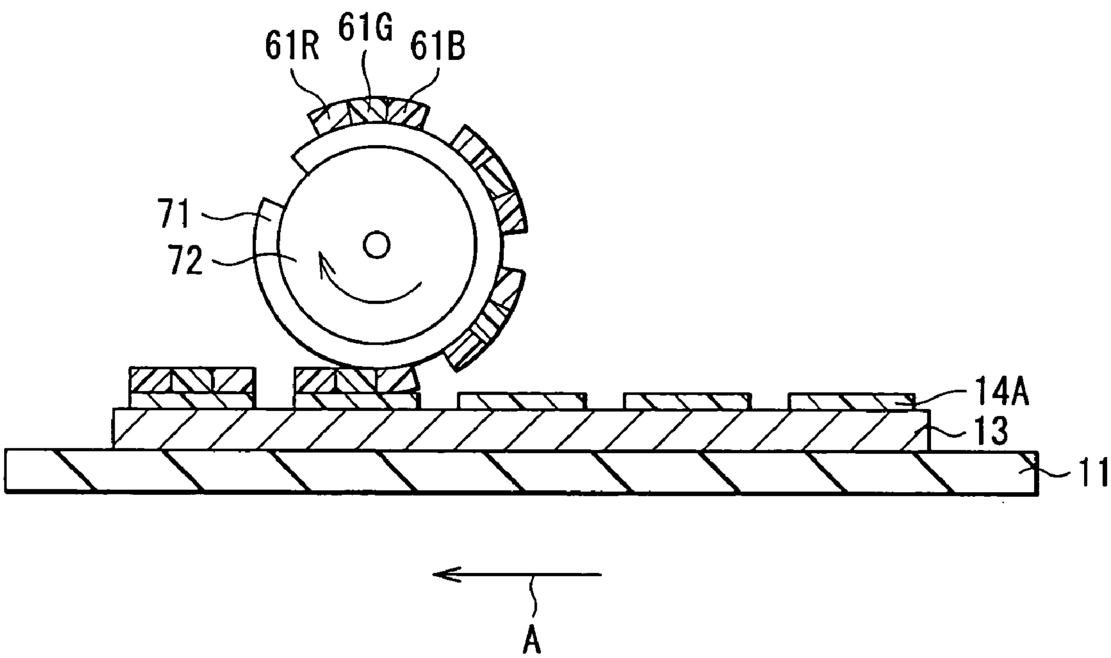
FIG. 14 is a cross sectional view showing a process following the process illustrated in FIG. 13C.

Next, as shown in FIG. 14, as in the case of the electron transport layer 14A, by rotating or rolling a roller for light emitting layer 72 on the driving substrate 11 on which the first electrode 13 and the electron hole transport layer 14A are formed, the red raw solution 61R, the green raw solution 61G, and the blue raw solution 61B are transferred at once. After that, the solvent is removed, and the light emitting layer 14B which has the red light emitting layer 14BR, the green light emitting layer 14BG, and the blue light emitting layer 14BB is formed.

Figure 12C:
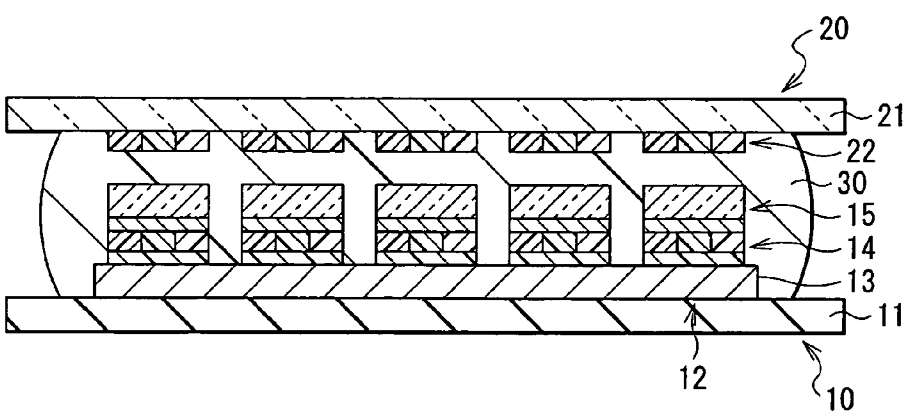

After that, the driving panel 10 and the sealing panel 20 are formed by a process shown in FIGS. 12A, 12B, and 12C, and then the driving panel 10 and the sealing panel 20 are bonded with the adhesive layer 30 in between. Consequently, the display unit shown in FIG. 2 is completed.

Though not shown in the figure, it is possible that the raw solution for electron hole transport layer 41, the red raw solution 61R, the green raw solution 61G, and the blue raw solution 61B are layered and applied on the same application face.

In the foregoing method, the raw solution for electron hole transport layer 41, the red raw solution 61R, the green raw solution 61G, and the blue raw solution 61B, which contain the material for the electron hole transport layer 14A or the polymeric organic light emitting material are used. However, instead of them, a raw solution containing a precursor material which becomes a material for them by polymerization can be used. In this case, it is possible that polymerization is made after transferring a solution containing the precursor material, and then the solvent is removed, or it is also possible that after making transfer and removing the solvent, polymerization is made.

In this display unit, when a certain voltage is applied between the first electrode 13 and the second electrode 15, current is applied to the light emitting layer 14B, and electron holes and electrons recombine, so that light emitting occurs. This light multiple-reflects between the first electrode 13 and the second electrode 15, and is extracted through the second electrode 15, the color filter 22, and the sealing substrate 21. Then, since the electron hole transport layer 14A and the light emitting layer 14B are formed by transferring the raw solution for electron hole transport layer 41, the red raw solution 61R, the green raw solution 61G, and the blue raw solution 61B, the film thickness distribution is reduced. Therefore, occurrence of irregular color is prevented, and images with high-definition and excellent color reproducibility can be obtained.

As above, according to the embodiment, since the electron hole transport layer 14A and the light emitting layer 14B are formed by transferring the raw solution for electron hole transport layer 41, the red raw solution 61R, the green raw solution 61G, and the blue raw solution 61B, film thickness distribution can be reduced. Therefore, occurrence of irregular color can be prevented, and images with high-definition and excellent color reproducibility can be obtained.

EXAMPLES

Further, concrete examples of the invention will be described in detail with reference to FIG. 2 by using the same symbols.

Example 1

As in the foregoing embodiment, on the driving substrate 11 made of glass, the first electrode 13 having a thickness of 230 nm made of chrome, the electron hole transport layer 14A having a thickness of 20 nm made of poly(3,4)-ethylene dioxythiophene, the red light emitting layer 14BR having a thickness of 75 nm made of the polymeric organic light emitting material shown in Chemical formula 1, the green light emitting layer 14BG having a thickness of 65 nm made of the polymeric organic light emitting material shown in Chemical formula 2, the blue light emitting layer 14BB having a thickness of 45 nm made of the polymeric organic light emitting material shown in Chemical formula 3, the semi-transparent electrode 15A having a laminated structure of a calcium layer having a thickness of 10 nm and an MgAg alloy layer having a thickness of 12 nm, and the transparent electrode 15B having a thickness of 300 nm made of ITO were sequentially layered to fabricate the driving panel 10 having the organic light emitting devices 12 on the driving substrate 11. When measuring film thickness distribution of the electron hole transport layer 14A and the light emitting layer 14B, the resulting value was 3% or less, which was within a tolerance for film thickness distribution to introduce the resonator structure.

Further, on the sealing substrate 21 made of glass, the color filters 22 having the red filter 22R, the green filter 22G, and the blue filter 22B were formed to fabricate the sealing panel 20. Subsequently, the driving panel 10 and the sealing panel 20 were bonded with the adhesive layer 30 in between, and the display unit shown in FIG. 2 was obtained.

As Comparative example 1 in relation to this example, the display unit was fabricated in a manner similar to this example, except that the electron hole transport layer 14A and the light emitting layer 14B were formed by ink jet printing method. When measuring film thickness distribution of the electron hole transport layer 14A and the light emitting layer 14B for the obtained display unit, the resulting value was high, i.e. about 10%.

Figure 1:
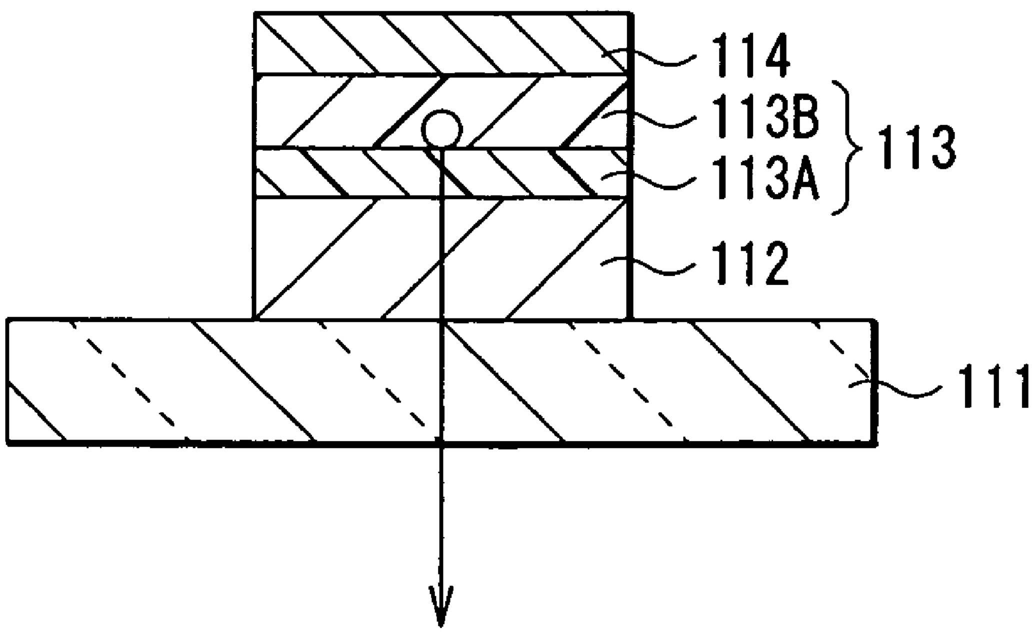
FIG. 1 is a cross sectional view showing a construction of a conventional organic light emitting device.

As Comparative example 2 in relation to this example, a display unit having an organic light emitting device shown in FIG. 1 was fabricated. This display unit was fabricated in a manner similar to this example, except that an electron hole transport layer 113A and a light emitting layer 113B were formed by ink jet printing method, a transparent electrode 112 was made of ITO, and a metal electrode 114 had a laminated structure of a calcium layer and an aluminum layer.

Images of the obtained display units of Example 1 and Comparative example 1 were visually checked. In this Example 1, images with sufficient high definition and excellent color reproducibility were obtained. However, in Comparative example 1, irregular color occurred and sufficient images could not be obtained.

Figure 15:
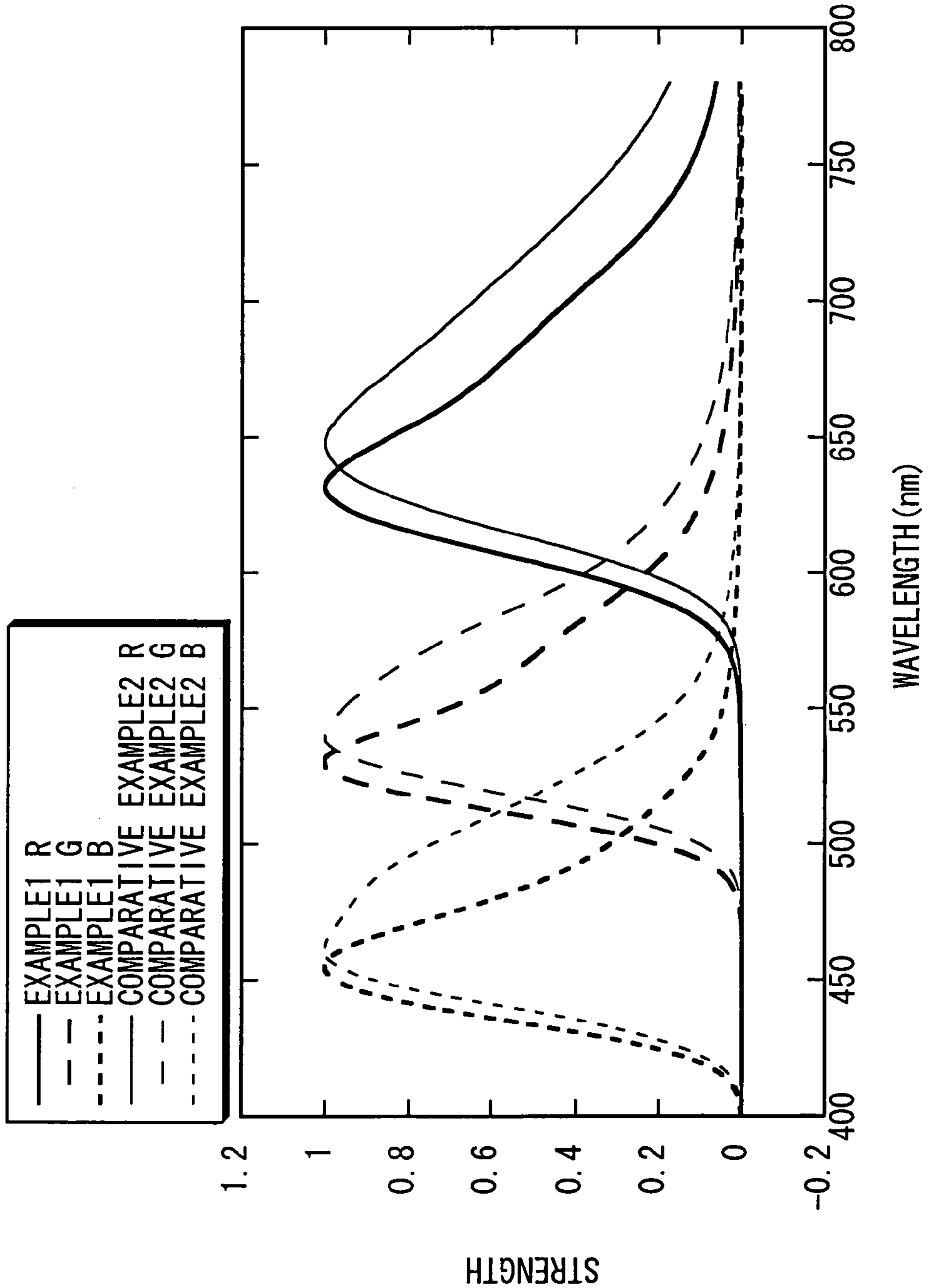
FIG. 15 is a figure showing light emitting spectrums of an organic light emitting device of Example 1 of the invention with light emitting spectrums of an organic light emitting device of Comparative example 2.

Further, light emitting spectrums of the organic light emitting devices were measured regarding display units of Example 1 and Comparative example 2. The results are shown in FIG. 15. As evidenced by FIG. 15, in Example 1, lights in wavelengths around wavelength λ of lights which were desired to be extracted were extracted by multiple reflection in the resonator structure, half-value widths of spectrums of respective colors became narrow, and color purity was improved. Meanwhile, in Comparative example 2, spectrum widths were wide, and peak wavelengths were shifted.

Figure 16:
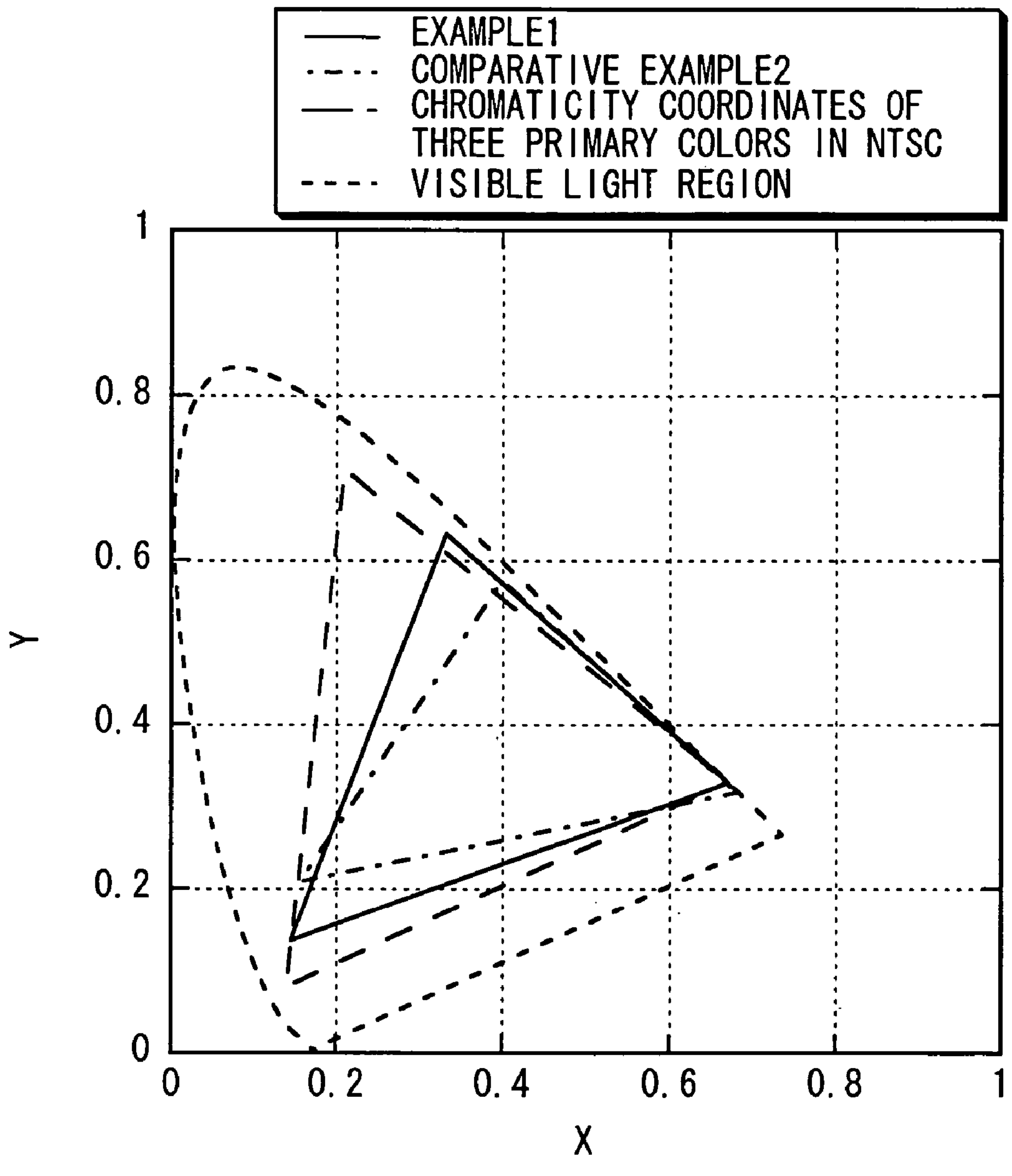
FIG. 16 is a chromaticity diagram showing chromaticity coordinates of three primary colors of the organic light emitting device of Example 1 of the invention with chromaticity coordinates of three primary colors of the organic light emitting device of Comparative example 2.

Regarding the obtained display units of Example 1 and Comparative example 2, chromaticity coordinates (x, y) of three primary colors (red, green and blue) of the organic light emitting devices were measured. As shown in FIG. 16, in Example 1, a coordinate of red was (0.633, 0.333), a coordinate of green was (0.330, 0.630), and a coordinate of blue was (0.157, 0.110). In Comparative example 2, a coordinate of red was (0.681, 0.317), a coordinate of green was (0.400, 0.575), and a coordinate of blue was (0.157, 0.208). In FIG. 16, chromaticity coordinates of three primary colors in NTSC (National Television System Committee) (red: (0.67, 0.33), green: (0.21, 0.71), and blue: (0.14, 0.08)) are also shown. As evidenced by FIG. 16, the chromaticity coordinates in Example 1 were closer to the chromaticity coordinates of three primary colors in NTSC than the coordinates in Comparative example 2 were, and chromaticity of green and blue was particularly improved in Example 1.

That is, it was found that when the electron hole transport layer 14A and the light emitting layer 14B were formed by transfer, film thickness distribution could be reduced; and when construction was made to have the resonator structure, image definition and color reproducibility could be improved.

Example 2

A display unit was fabricated in a manner similar to Example 1, except that the electron hole transport layer 14A was made of polyaniline. When light emitting spectrums and chromaticity coordinates of three primary colors were measured, results similar to those in Example 1 were obtained.

While the invention has been described with reference to the embodiment and examples, the invention is not limited to the foregoing embodiment and examples, and various modifications may be made. For example, materials, thicknesses, deposition methods, and deposition conditions for each layer are not limited to those described in the foregoing embodiment and the foregoing examples, and other materials, thicknesses, deposition methods, and deposition conditions can be applied. For example, though in the foregoing embodiment and the foregoing examples, the case wherein the organic layer 14 is made of a high molecular weight material has been described, the invention can be applied to a case using an oligomer material having a molecular mass of 1,000 to 10,000, or a case using a low molecular weight material having a molecular mass of 1,000 or less. However, when the material having a high molecular mass is used, more significant effect can be obtained.

Further, for example, in the foregoing embodiment and the foregoing examples, the case wherein the organic layer 14 has a two-layer structure of the electron hole transport layer 14A and the light emitting layer 14B has been described. However, the organic layer 14 can have other structure such as a single layer structure of the light emitting layer only, a two-layer structure of the light emitting layer and the electron transport layer, and a three-layer structure of the electron transport layer, the light emitting layer, and the electron transport layer.

Further, in the foregoing embodiment and the foregoing examples, the case wherein both the electron hole transport layer 14A and the light emitting layer 14B are formed by transfer has been described. However, when at least part of the organic layer 14 is manufactured by this method, effects can be obtained. The same is equally true of the case wherein only the light emitting layer is provided, or the case wherein a layer other than the electron hole transport layer 14A and the light emitting layer 14B is provided as mentioned above.

In addition, in the foregoing embodiment and the foregoing examples, though the case wherein the resonator structure which resonates the lights generated in the light emitting layer 14B between the first end P1 and the second end P2 is provided has been described, it is possible that the resonator structure is not provided. However, since control of the film thickness becomes particularly important when the foregoing resonator structure is provided, significant effect can be obtained by the invention.

Further, in the foregoing embodiment and the foregoing examples, the case wherein the organic layer 14 including the light emitting layer 14B between the first electrode 13 and the second electrode 15 is provided has been described. However, the invention can be applied to the case wherein construction is made of other material.

Further, for example, in the foregoing embodiment and the foregoing examples, the case wherein the first electrode 13 is set to an anode and the second electrode 15 is set to a cathode has been described. However, the anode and the cathode can be reversed, that is, the first electrode 13 can be set to a cathode and the second electrode 15 can be set to an anode.

Further, for example, in the foregoing embodiment and the foregoing examples, the case wherein the first electrode 13, the organic layer 14, and the second electrode 15 are sequentially layered on the driving substrate 11 from the driving substrate 11 side, and lights are extracted from the sealing panel 20 side has been described. However, the lamination order can be reversed, that is, the second electrode 15, the organic layer 14, the first electrode 13 are sequentially layered on the driving substrate 11 from the driving substrate 11 side, and lights can be extracted from the driving substrate 11 side. Further, it is possible that the first electrode 13 is set to a cathode and the second electrode 15 is set to an anode, and the second electrode 15, the organic layer 14, and the first electrode 13 are sequentially layered on the driving substrate 11 from the driving substrate 11 side, and lights are extracted from the driving substrate 11 side. However, it is preferable that the first electrode 13, the organic layer 14, and the second electrode 15 are sequentially layered from the driving substrate 11 side and lights are extracted from the second electrode 15 side, rather than that lights are extracted from the driving substrate 11 side wherein a structure part such as TFT (thin film transistor) or the like is formed, since opening ratio can be raised and high luminance and high resolution can be obtained. Further, extracting lights from the second electrode 15 side as mentioned above is preferable since excellent color purity can be also realized by introducing the resonator structure.

Further, in the foregoing embodiment and the foregoing examples, descriptions have been made with reference to the concrete construction of the organic light emitting device 12. However, it is not necessary to provide all layers, and other layer can be provided additionally. For example, it is possible that a thin film layer for injecting electron holes made of chromic oxide (III) ($Cr_2O_3$), ITO and the like can be provided between the first electrode 13 and the organic layer 14. It is also possible that the organic light emitting device 12 is covered with a protective film composed of a transparent dielectric, and the adhesive layer 30 is formed on the protective film. This protective film has, for example, a thickness of 500 nm to 1,000 nm, and can be made of silicon oxide ($SiO_2$), silicon nitride (SiN) and the like. Further, for example, it is possible that the first electrode 13 has a two-layer structure wherein a transparent conductive film is layered on a reflective film such as a dielectric multilayer film or aluminum. In this case, an end face of the reflective film on the light emitting layer side constructs an end of a resonance part, and the transparent conductive film constructs part of a resonance part.

Further, in the foregoing embodiment and the foregoing examples, the case having a structure wherein the semi-transparent electrode 15A and the transparent electrode 15B of the second electrode 15 are layered from the first electrode 13 side has been described. However, the second electrode 15 can be comprised of only the semi-transparent electrode.

Further, in the foregoing embodiment and the foregoing examples, it is possible that a resonator structure wherein the semi-transparent electrode 15A is used as one end, the other end is located on the transparent electrode 15B on the side opposite to the semi-transparent electrode 15A, and the transparent electrode 15B is used as a resonance part is formed. Further, under the condition of providing such a resonator structure, it is preferable that the organic light emitting device 12 is covered with a protective film, and this protective film is made of a material having refractive index nearly equal to that of the material for the transparent electrode 15B, since the protective film can be part of the resonance part.

Further, the invention can be applied to the case wherein the second electrode 15 is composed of only the transparent electrode 15B, reflectance of an end face of this transparent electrode 15B on the opposite side of the organic layer 13 is set to large, and a resonator structure in which an end face of the first electrode 13 on the light emitting layer 14B side is the first end and an end face of the transparent electrode 15B on the opposite side of the organic layer 14 is the second end is constructed. For example, it is possible that the transparent electrode 15B is contacted to atmospheric layer, reflectance of an interface between the transparent electrode 15B and the atmospheric layer is raised, and this interface is set to the second end. Further, it is possible that reflectance of an interface between the transparent electrode 15B and the adhesive layer 30 is raised and this interface is set to the second end. Further, it is possible that the organic light emitting device 12 is covered with a protective film, reflectance of the interface between the transparent electrode 15B and this protective film is raised, and this interface is set to the second end.

Figure 17:
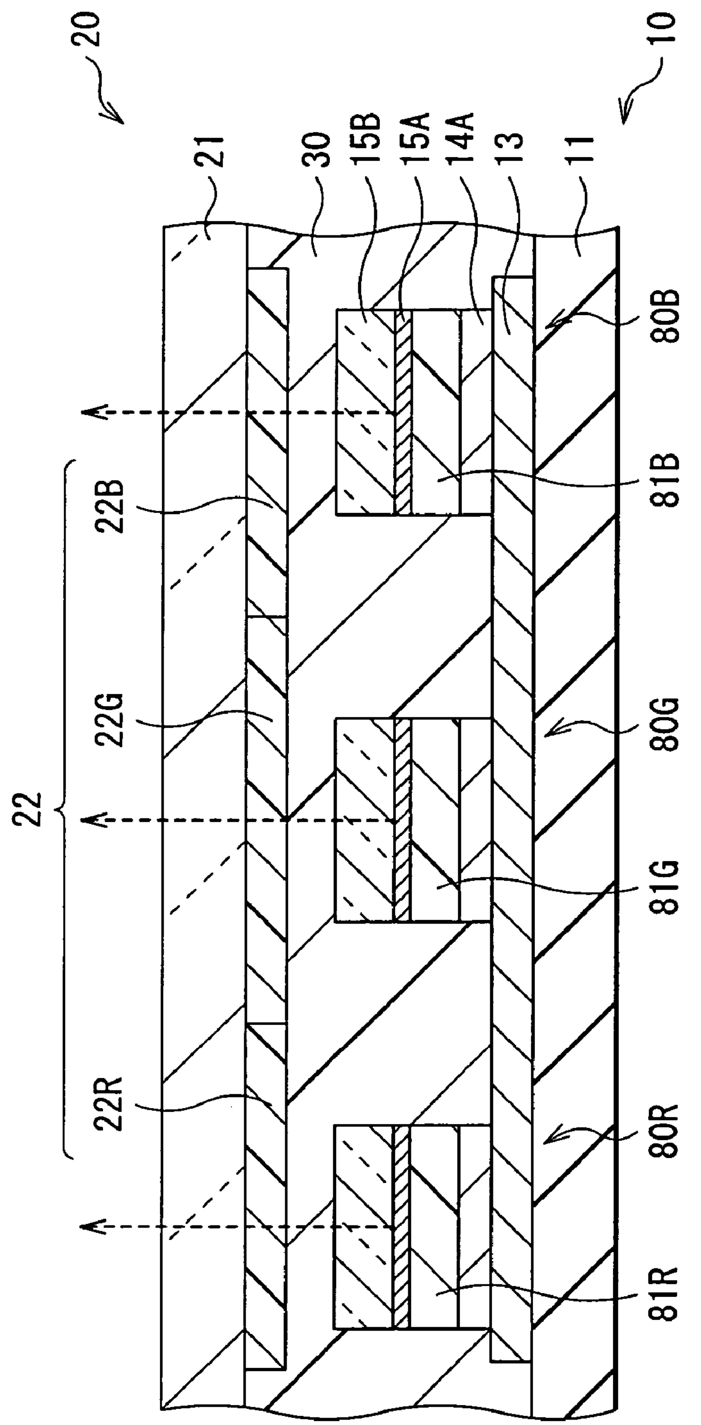
FIG. 17 is a cross sectional view showing a modification of the display unit illustrated in FIG. 2.

Further, in the foregoing embodiment and the foregoing examples, the case wherein one organic light emitting device 12 has the red light emitting layer 14BR, the green light emitting layer 14BG, and the blue light emitting layer 14BB has been described. However, in the invention, as shown in FIG. 17, it is possible that an organic light emitting device 80R having a red light emitting layer 81R, an organic light emitting device 80G having a green light emitting layer 81G, and an organic light emitting device 80B having a blue light emitting layer 81B are separately arranged on the driving substrate 11.

Further, in the foregoing embodiment and the foregoing examples, the case of the full color display unit has been described. However, the invention can be applied to a unicolor display unit.

As described above, according to the light emitting device of the invention and the display unit of the invention, at least part of the layer including the light emitting layer is formed by transferring the raw solution, and then removing the solvent. Therefore, film thickness distribution can be reduced. Consequently, occurrence of irregular color can be prevented, and images with high definition and excellent color reproducibility can be obtained.

Obviously many modifications and variations of the present invention are possible in the light of the above teachings. It is therefore to be understood that within the scope of the appended claims the invention may be practiced otherwise than as specifically described.

What is claimed is:

1. A light emitting device which comprises a layer including a light emitting layer between a first electrode and a second electrode, wherein:

at least part of such layer including the light emitting layer is formed with uniform thickness by (1) transferring a raw solution and then (2) removing a solvent.

2. A light emitting device which comprises a layer including a light emitting layer between a first electrode and a second electrode, wherein:

at least part of the layer including the light emitting layer is formed by transferring a raw solution and then removing a solvent, wherein:

a resonator structure which resonates lights generated in the light emitting layer between the first end and the second end is selected to be a positive minimum value to satisfy Mathematical formula 1:

$$(2L)/\lambda+\Phi/(2\pi)=m \quad \text{[Mathematical formula 1]}$$

where, L represents an optical distance between the first end and the second end, λ represents a peak wavelength of a spectrum of a light desired to be extracted, Φ represents a phase shift of reflected lights generated in the first end and the second end, and m represents an integer, respectively.

3. A light emitting device according to claim 2, wherein:

the first electrode, the layer including the light emitting layer, and the second electrode are layered in this order on a driving substrate from the first electrode side, and lights generated in the light emitting layer are extracted from the second electrode side.

4. A light emitting device according to claim 1, wherein the layer including the light emitting layer is an organic layer.

5. A light emitting device according to claim 1, wherein the light emitting layer is formed with uniform thickness by transferring a raw solution containing an organic light emitting material, or a precursor material which becomes an organic light emitting material by polymerization.

6. A light emitting device according to claim 5, wherein the light emitting layer has a red light emitting layer, a green light emitting layer, and a blue light emitting layer which are provided in parallel with each other between the first electrode and the second electrode.

7. A light emitting device according to claim 5, wherein the light emitting layer is formed with uniform thickness by (1) applying the raw solution onto an application face, (2) selectively removing the raw solution on the application face, and then (3) transferring the raw solution remaining on the application face.

8. A light emitting device according to claim 5, wherein the layer including the light emitting layer has at least one layer formed by transferring the raw solution other than the light emitting layer.

9. A display unit which comprises a light emitting device comprising a layer including a light emitting layer between a first electrode and a second electrode, wherein:

at least part of such layer including the light emitting layer is formed with uniform thickness by (1) transferring a raw solution and then (2) removing a solvent.

10. A display unit which comprises a light emitting device comprising a layer including a light emitting layer between a first electrode and a second electrode, wherein:

a resonator structure which resonates lights generated in the light emitting layer between a first end and a second end is provided, and an optical distance L between the first end and the second end is selected to be a positive minimum value to satisfy Mathematical formula 2:

$$(2L)/\lambda+\Phi/(2\pi)=m \quad \text{[Mathematical formula 2]}$$

where, L represents an optical distance between the first end and the second end, λ represents a peak wavelength of a spectrum of a light desired to be extracted, Φ represents a phase shift of reflected lights generated in the first end and the second end, and m represents an integer, respectively.

11. A display unit according to claim 10, wherein the first electrode, the layer including the light emitting layer, and the second electrode are layered in this order on a driving substrate from the first electrode side, and lights generated in the light emitting layer are extracted from the second electrode side.

12. A display unit according to claim 9, wherein the layer including the light emitting layer is an organic layer.

13. A display unit according to claim 9, wherein the light emitting layer is formed with uniform thickness by transferring a raw solution containing an organic light emitting material, or a precursor material which becomes an organic light emitting material by polymerization.

14. A display unit according to claim 13, wherein the light emitting layer has a red light emitting layer, a green light emitting layer, and a blue light emitting layer which are provided in parallel with each other between the first electrode and the second electrode.

15. A display unit according to claim 13, wherein the light emitting layer is formed with uniform thickness by (1) applying the raw solution onto an application face, (2) selectively removing the raw solution on the application face, and then (3) transferring the raw solution remaining on the application face.

16. A display unit according to claim 13, wherein the layer including the light emitting layer has at least one layer formed by transferring the raw solution other than the light emitting layer.

* * * * *